(12) United States Patent
Numakura

(10) Patent No.: US 9,305,814 B2
(45) Date of Patent: Apr. 5, 2016

(54) METHOD OF INSPECTING SUBSTRATE PROCESSING APPARATUS AND STORAGE MEDIUM STORING INSPECTION PROGRAM FOR EXECUTING THE METHOD

(75) Inventor: Masahiro Numakura, Miyagi-gun (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1683 days.

(21) Appl. No.: 11/311,549

(22) Filed: Dec. 20, 2005

(65) Prior Publication Data

US 2006/0181699 A1    Aug. 17, 2006

Related U.S. Application Data

(60) Provisional application No. 60/641,078, filed on Jan. 4, 2005.

(30) Foreign Application Priority Data

Dec. 20, 2004  (JP) ................................. 2004-368282

(51) Int. Cl.
*H01L 21/67* (2006.01)
*H01L 21/677* (2006.01)

(52) U.S. Cl.
CPC .... *H01L 21/67276* (2013.01); *H01L 21/67167* (2013.01); *H01L 21/67253* (2013.01); *H01L 21/67745* (2013.01); *H01L 21/67778* (2013.01)

(58) Field of Classification Search
None
See application file for complete search history.

(56) References Cited

U.S. PATENT DOCUMENTS

| 5,911,833 A * | 6/1999 | Denison et al. ................. 134/1.1 |
| 6,795,745 B1 * | 9/2004 | Ueno et al. ..................... 700/121 |

(Continued)

FOREIGN PATENT DOCUMENTS

| JP | 7-29958 | 1/1995 |
| JP | 2730538 | 3/1998 |
| JP | 11-67869 | 3/1999 |

(Continued)

OTHER PUBLICATIONS

JPO machine translation of JP 11-111810 A, published Apr. 23, 1999.*

(Continued)

*Primary Examiner* — Anita Alanko
(74) *Attorney, Agent, or Firm* — Oblon, McClelland, Maier & Neustadt, L.L.P.

(57) ABSTRACT

A method of inspecting a substrate processing apparatus, which is capable of preventing product substrates from being supplied to a substrate processing chamber to be inspected, and inspecting the substrate processing chamber in desired timing. Product wafers W (product substrates) are inhibited from being conveyed into a processing unit to be inspected (substrate processing chamber) according to a selection of a menu option "QC MODE" by an operator, or in response to instruction from a host computer. A QC wafer is permitted to be conveyed from a carrier connected to an associated load port 24 into the processing unit to be inspected, in response to a notification the fact that a wafer stored in the carrier connected to the associated load port 24 is the QC wafer.

6 Claims, 7 Drawing Sheets

(56) References Cited

U.S. PATENT DOCUMENTS

| | | | |
|---|---|---|---|
| 7,076,320 B1* | 7/2006 | Phan et al. | 700/121 |
| 7,108,752 B2* | 9/2006 | Kuroda | 118/712 |
| 7,191,082 B2* | 3/2007 | Obi et al. | 702/81 |
| 7,455,747 B2* | 11/2008 | Shimizu et al. | 156/345.24 |
| 7,640,072 B2* | 12/2009 | Shimizu et al. | 700/121 |
| 2003/0182084 A1* | 9/2003 | Tanaka et al. | 702/184 |
| 2005/0129839 A1* | 6/2005 | Numakura | 427/58 |

FOREIGN PATENT DOCUMENTS

| | | |
|---|---|---|
| JP | 11-111810 | 4/1999 |
| JP | 11111810 A * | 4/1999 |

OTHER PUBLICATIONS

Office Action issued Nov. 30, 2010, in Japan Patent Application No. 2004-368282 (with English-language Translation).

\* cited by examiner

METHOD OF INSPECTING SUBSTRATE PROCESSING APPARATUS AND STORAGE MEDIUM STORING INSPECTION PROGRAM FOR EXECUTING THE METHOD

BACKGROUND OF THE INVENTION

1. Field of the Invention

The present invention relates to a method of inspecting a substrate processing apparatus and a storage medium storing an inspection program for executing the method, and more particularly to a method of inspecting a substrate processing apparatus using a substrate conveyed therein.

2. Description of the Related Art

A substrate processing apparatus for performing predetermined processing on substrates is comprised of a plurality of processing units (substrate processing chambers) as vacuum processing chambers, a load-lock chamber as a conveying chamber which is connected to the processing units and whose internal pressure is switched between vacuum and atmospheric pressure, a carrier-mounting stage on which carrier boxes containing a plurality of substrates are placed, and a loader unit as a conveying chamber which is disposed between the load-lock chamber and the carrier-mounting stage and whose internal pressure is set to atmospheric pressure.

In the substrate processing apparatus, a substrate is conveyed from one of the carrier boxes to one of the processing units via the loader unit and the load-lock chamber, and subjected to plasma processing, such as etching, in the processing unit. In this case, when particles are deposited on the substrate or when the etching rate in the processing falls outside a predetermined range, the manufacturing yield of semiconductor devices made of the substrates is degraded.

The amount of particles deposited on each substrate and the etching rate change depending on the condition of the substrate processing apparatus, especially the condition of the processing unit as a component thereof, and therefore in the substrate processing apparatus, it is necessary to inspect the condition of each processing unit periodically.

Conventionally, to inspect the condition of the processing unit periodically, there has been employed a method of investigating the inside of the processing unit by opening the lid thereof. According to this method, however, it takes time to reproduce a vacuum in the processing unit after inspection, which makes it impossible to inspect the processing unit frequently.

To solve this problem, there has recently been developed a method of inspecting the condition of the processing unit by conveying an inspection substrate different from product substrates into the substrate processing apparatus for etching, and measuring the amount of particles deposited on the etched inspection substrate and the etching rate. This method makes it unnecessary to open the lid of the processing unit, and hence makes it possible to inspect the processing unit frequently.

As the method using the inspection substrate, there have been proposed a method in which the operator designates a processing unit to be inspected, whereafter a carrier box containing the inspection substrate is placed on the carrier-mounting stage, and the inspection substrate is conveyed into the processing unit to be inspected, for processing the inspection substrate, and a method in which the operator inserts the inspection substrate into a sorter storing product substrates according to a process procedure stored in advance in the apparatus, whereafter the inspection substrate is conveyed into the processing apparatus, for being processed (see e.g. the publication of Japanese Patent No. 2730538).

However, in the method in which the operator designates a processing unit to be inspected, the operator alone can determine the type of substrate supplied to the processing unit to be inspected, and hence if the operator is not aware that the processing unit to which he/she is about to supply the substrate is a processing unit to be inspected, he can erroneously supply a product substrate into the processing unit to be inspected.

Further, in the method making use of the process procedure stored in advance in the apparatus, the inspection substrate is inserted into the sorter according to the process procedure and further conveyed into the processing apparatus. Therefore, there is no fear that product substrates are erroneously supplied, but the operator is required to prepare the process procedure in advance, which makes it impossible to inspect the condition of a processing unit in desired timing.

SUMMARY OF THE INVENTION

It is an object of the present invention to provide a method of inspecting a substrate processing apparatus, which is capable of preventing product substrates from being supplied to a substrate processing chamber to be inspected, and inspecting the substrate processing chamber in desired timing, and a storage medium storing an inspection program for executing the method.

To attain the above object, in a first aspect of the present invention, there is provided a method of inspecting a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, comprising a substrate carrying-in inhibiting step of inhibiting the product substrates from being conveyed into the substrate processing chamber, in response to an external instruction, and an inspection substrate carrying-in permitting step of permitting an inspection substrate to be conveyed from a predetermined one of the containers which is connected to the inlet port into the substrate processing chamber, in response to a notification that the predetermined container contains the inspection substrate.

With the configuration of the first aspect of the present invention, in response to an external instruction, product substrates are inhibited from being conveyed into a substrate processing chamber, and in response to a notification that a predetermined container connected to an inlet port contains an inspection substrate, the inspection substrate is permitted to be conveyed from the predetermined container into the substrate processing chamber. Therefore, it is possible to prevent product substrates from being supplied to the substrate processing chamber to be inspected, and inspect the substrate processing chamber in desired timing by providing the above notification in desired timing.

Preferably, the method of inspecting a substrate processing apparatus comprises an inspection substrate carrying-in start step of starting conveying the inspection substrate into the substrate processing chamber in response to an external instruction.

With the configuration of this preferred embodiment, the inspection substrate starts to be conveyed into the substrate processing chamber in response to the external instruction, and therefore it is possible to reliably prevent the product substrates from being supplied to the substrate processing chamber to be inspected.

Preferably, the method of inspecting a substrate processing apparatus comprises a substrate carrying-in inhibition-canceling step of canceling inhibition of carrying-in of the product substrates into the substrate processing chamber in response to an external instruction.

With the configuration of this preferred embodiment, inhibition of conveying the product substrates into the substrate processing chamber is canceled in response to the external instruction. This makes it possible to smoothly resume processing of the product substrates after inspection of the substrate processing apparatus.

Preferably, the substrate processing apparatus is provided with a display section for displaying a button for instructing starting of the processing, and the display section displays a button for instructing starting of inspection of the substrate processing apparatus in response to the notification that the predetermined container connected to the inlet port contains the inspection substrate.

With the configuration of this preferred embodiment, the substrate processing apparatus is provided with a display section for displaying a button for instructing starting of the processing, and the display section displays a button for instructing starting inspection of the substrate processing apparatus in response to the notification that the predetermined container connected to the inlet port contains the inspection substrate. Therefore, the operator can easily recognize that the substrate processing chamber to which he/she is about to supply the inspection substrate is a substrate processing chamber to be inspected, and start inspection of the substrate processing chamber by the same operation as performed at the start of processing of product substrates. This makes it possible to lessen burden on the operator.

To attain the above object, in a second aspect of the present invention, there is provided a method of inspecting a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, comprising a substrate carrying-in inhibiting step of inhibiting the product substrates from being conveyed into the substrate processing chamber, in response to an external instruction, and an inspection substrate carrying-in permitting step of permitting an inspection substrate to be conveyed from a predetermined one of the containers connected to the inlet port into the substrate processing chamber when a transfer path including the substrate processing chamber is set as a transfer path for transferring the inspection substrate contained in the predetermined container.

With the configuration of the second aspect of the present invention, in response to an external instruction, the product substrates are inhibited from being conveyed into the substrate processing chamber, and when a transfer path including the substrate processing chamber is set as a transfer path for transferring an inspection substrate contained in a predetermined container connected to one of inlet ports, the inspection substrate is permitted to be conveyed from the predetermined container into the substrate processing chamber. Therefore, it is possible to prevent product substrates from being supplied to the substrate processing chamber to be inspected, and inspect the substrate processing chamber in desired timing by performing the above setting in desired timing.

To attain the above object, in a third aspect of the present invention, there is provided a method of inspecting a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, comprising a substrate-inspecting step of inspecting a processed product substrate, a substrate carrying-in inhibiting step of inhibiting the product substrates from being conveyed into the substrate processing chamber depending on a result of the inspection of the processed product substrate, and an inspection substrate carrying-in permitting step of permitting an inspection substrate to be conveyed from a predetermined one of the containers which is connected to the inlet port into the substrate processing chamber, in response to a notification that the predetermined container contains the inspection substrate.

With the configuration of the third aspect of the present invention, a processed product substrate is inspected; product substrates are inhibited from being conveyed into the substrate processing chamber depending on the result of the inspection of the processed product substrate; and an inspection substrate is permitted to be conveyed from a predetermined container connected to one of the inlet ports into the substrate processing chamber in response to a notification that the predetermined container contains the inspection substrate. Therefore, it is possible to prevent product substrates from being supplied into the substrate processing chamber to be inspected, and dispense with the need for the operator to set timing for inspecting the substrate processing chamber, thereby making it possible to lessen burden on the operator.

To attain the above object, in a fourth aspect of the present invention, there is provided a method of inspecting a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, comprising a management item-monitoring step of monitoring a management item of the substrate processing apparatus, a substrate carrying-in inhibiting step of inhibiting the product substrates from being conveyed into the substrate processing chamber depending on a result of the monitoring of the management item, and an inspection substrate carrying-in permitting step of permitting an inspection substrate to be conveyed from a predetermined one of the containers which is connected to the inlet port into the substrate processing chamber, in response to a notification that the predetermined container contains the inspection substrate.

With the configuration of the fourth aspect of the present invention, a management item of the substrate processing apparatus is monitored; the product substrates are inhibited from being conveyed into the substrate processing chamber depending on the result of the monitoring of the management item; and an inspection substrate is permitted to be conveyed from a predetermined container connected to one of the inlet ports into the substrate processing chamber in response to a notification that the predetermined container contains the inspection substrate. As a result, it is possible to prevent product substrates from being supplied into the substrate processing chamber to be inspected, and dispense with the need for the operator to set timing for inspecting the substrate processing chamber, thereby making it possible to lessen burden on the operator.

To attain the above object, in a fifth aspect of the present invention, there is provided a computer-readable storage medium storing an inspection program for causing a computer to execute a method of inspecting a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, the inspection program comprising a substrate carrying-in inhibiting module for inhibiting the product substrates from being conveyed into the substrate processing chamber, in response to an external instruction, and an inspection substrate carrying-in permitting module for permitting an inspection substrate to be conveyed from a predetermined one of the containers which is connected to the inlet port into the substrate processing chamber, in response to a notification that the predetermined container contains the inspection substrate.

To attain the above object, in a sixth aspect of the present invention, there is provided a computer-readable storage medium storing an inspection program for causing a computer to execute a method of inspecting a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, the inspection program comprising a substrate carrying-in inhibiting module for inhibiting the product substrates from being conveyed into the substrate processing chamber, in response to an external instruction, and an inspection substrate carrying-in permitting module for permitting an inspection substrate to be conveyed from a predetermined one of the containers which is connected to the inlet port into the substrate processing chamber when a transfer path including the substrate processing chamber is set as a transfer path for transferring the inspection substrate contained in the predetermined container.

To attain the above object, in a seventh aspect of the present invention, there is provided a computer-readable storage medium storing an inspection program for causing a computer to execute a method of inspecting a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, the inspection program comprising a substrate-inspecting module for inspecting a processed product substrate, a substrate carrying-in inhibiting module for inhibiting the product substrates from being conveyed into the substrate processing chamber depending on a result of the inspection of the processed product substrate, and an inspection substrate carrying-in permitting module for permitting an inspection substrate to be conveyed from a predetermined one of the containers which is connected to the inlet port into the substrate processing chamber, in response to a notification that the predetermined container contains the inspection substrate.

To attain the above object, in an eighth aspect of the present invention, there is provided a computer-readable storage medium storing an inspection program for causing a computer to execute a method of inspecting a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, the inspection program comprising a management item-monitoring module for monitoring a management item of the substrate processing apparatus, a substrate carrying-in inhibiting module for inhibiting the product substrates from being conveyed into the substrate processing chamber depending on a result of the monitoring of the management item, and an inspection substrate carrying-in permitting module for permitting an inspection substrate to be conveyed from a predetermined one of the containers which is connected to the inlet port into the substrate processing chamber, in response to a notification that the predetermined container contains the inspection substrate.

The above and other objects, features, and advantages of the invention will become more apparent from the following detailed description taken in conjunction with the accompanying drawings.

BRIEF DESCRIPTION OF THE DRAWINGS

FIGS. 7A and 7B are plan views schematically showing the respective arrangements of substrate processing apparatuses to which are applied the methods of inspecting a substrate processing apparatus according to the first to third embodiments of the present invention, in which:

FIG. 7A is a diagram showing a substrate processing apparatus of a cluster type; and FIG. 7B is a diagram showing a substrate processing apparatus having a double arm-type transfer arm.

DETAILED DESCRIPTION OF THE PREFERRED EMBODIMENTS

The present invention will now be described in detail with reference to the drawings showing a preferred embodiment thereof.

First of all, a description will be given of a method of inspecting a substrate processing apparatus according to a first embodiment of the present invention.

Figure 1:
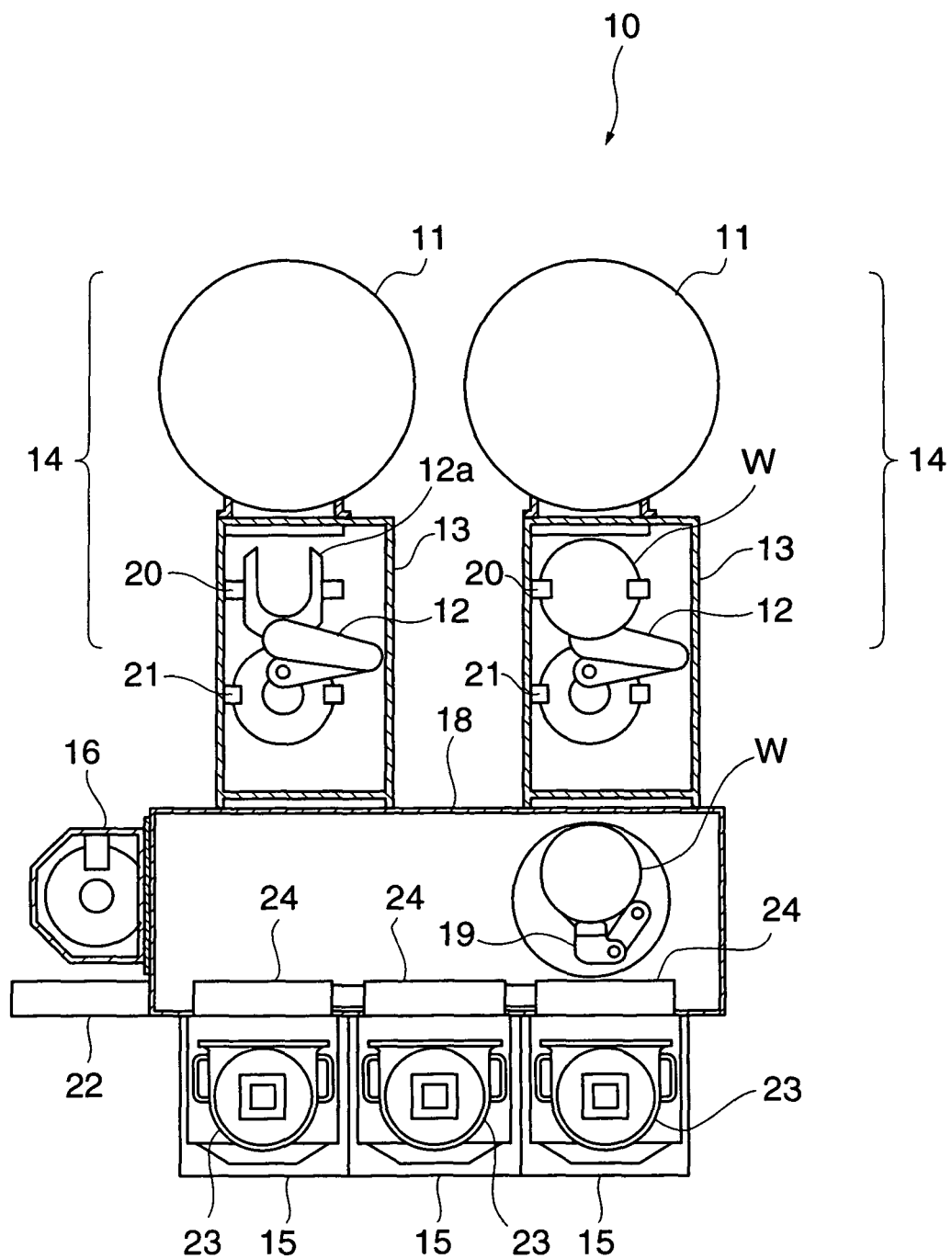
FIG. 1 is a plan view schematically showing the arrangement of a substrate processing apparatus to which is applied a method of inspecting a substrate processing apparatus according to a first embodiment of the present invention.

FIG. 1 is a plan view schematically showing the arrangement of a substrate processing apparatus to which is applied the method of inspecting a substrate processing apparatus according to the present embodiment.

As shown in FIG. 1, the substrate processing apparatus 10 as an etching apparatus is comprised of two process ships 14 for performing processing on wafers W for semiconductor devices (hereinafter referred to as "product wafers W"), three carrier-mounting stages 15 on which carrier boxes 23 are placed, respectively, an orienter 16 which performs pre-alignment of the position of a product wafer W, and a loader unit 18 as a rectangular common conveying chamber.

The process ships 14 are each comprised of a processing unit 11 as a vacuum processing chamber in which etching is carried out on the product wafers W, and a load lock chamber 13 containing a link-type single pick transfer arm for transferring the product wafers W to the processing unit 11, and each perform etching on the product wafers W, on a wafer-by-wafer basis.

In the substrate processing apparatus 10, the two process ships 14, the three carrier-mounting stages 15, and the orienter 16 are removably connected to the loader unit 18, with the process ships 14 being disposed in a manner opposed to the carrier-mounting stages 15 via the loader unit 18, and the orienter 16 being disposed at one end of the loader unit 18 in a longitudinal direction of the loader unit 18.

The loader unit 18 includes a SCARA-type dual-arm conveyor arm mechanism 19 for conveying the product wafers W placed therein, and three load ports 24 arranged in a side wall as inlet ports for introducing the product wafers W, in association with the respective carrier-mounting stages 15.

Each carrier box 23 is a container storing twenty-five product wafers W. When the carrier box 23 is placed on the associated carrier-mounting stage 15, the conveyor mechanism 19 takes out a product wafer W from the carrier box 23 through the associated load port 24. The conveyor arm mechanism 19 carries the product wafer W into one of the process ships 14 and the orienter 16 as well.

The processing unit 11 includes a hollow cylindrical processing chamber (hereinafter referred to as "the chamber"). The chamber has an upper electrode and a lower electrode, and the distance between the upper electrode and the lower electrode is set to an appropriate value for performing etching on the product wafer W. Further, the lower electrode has an ESC (Electro-Static Chucks) for chucking the product wafer W e.g. by a coulomb force on a top thereof.

In the processing unit 11, a process gas is introduced into the chamber and an electric field is generated between the upper electrode and the lower electrode, whereby the introduced process gas is activated to generate plasma, which is used for etching the product wafer W.

The internal pressure of the loader unit 18 is held equal to atmospheric pressure, while the internal pressure of the processing unit 11 is held at vacuum. Therefore, the load lock chamber 13 is provided with a vacuum gate valve in a connecting part connected to the processing unit 11, and an atmospheric gate valve in a connecting part connected to the loader unit 18, whereby each load lock chamber 13 is configured as a vacuum preliminary conveying chamber whose inner pressure can be adjusted.

Within each load lock chamber 13, a conveyor arm 12 is disposed in an approximately central portion of the chamber, with first buffers 20 disposed toward the processing unit 11 with respect to the conveyor arm 12, and second buffers 21 disposed toward the loader unit 18 with respect to the conveyor arm 12. The first buffers 20 and the second buffers 21 are arranged on tracks on which moves a supporting portion (pick) 12a provided at the distal end of the conveyor arm 12, for supporting the product wafer W.

The substrate processing apparatus 10 includes a control section (not shown) for controlling operations of component elements thereof, and further an operation controller 22 disposed at the one end of the loader unit 18 in the longitudinal direction thereof.

The control section is a device comprised of a CPU, a RAM, and an HDD, and the CPU sends control signals to the component elements in accordance with control programs loaded from the HDD into the RAM to thereby control the operations of the component elements. The operation controller 22 has a display section 25, referred to hereinafter, which is formed e.g. by an LCD (Liquid Crystal Display) for displaying respective operating conditions of the component elements.

Figure 2:
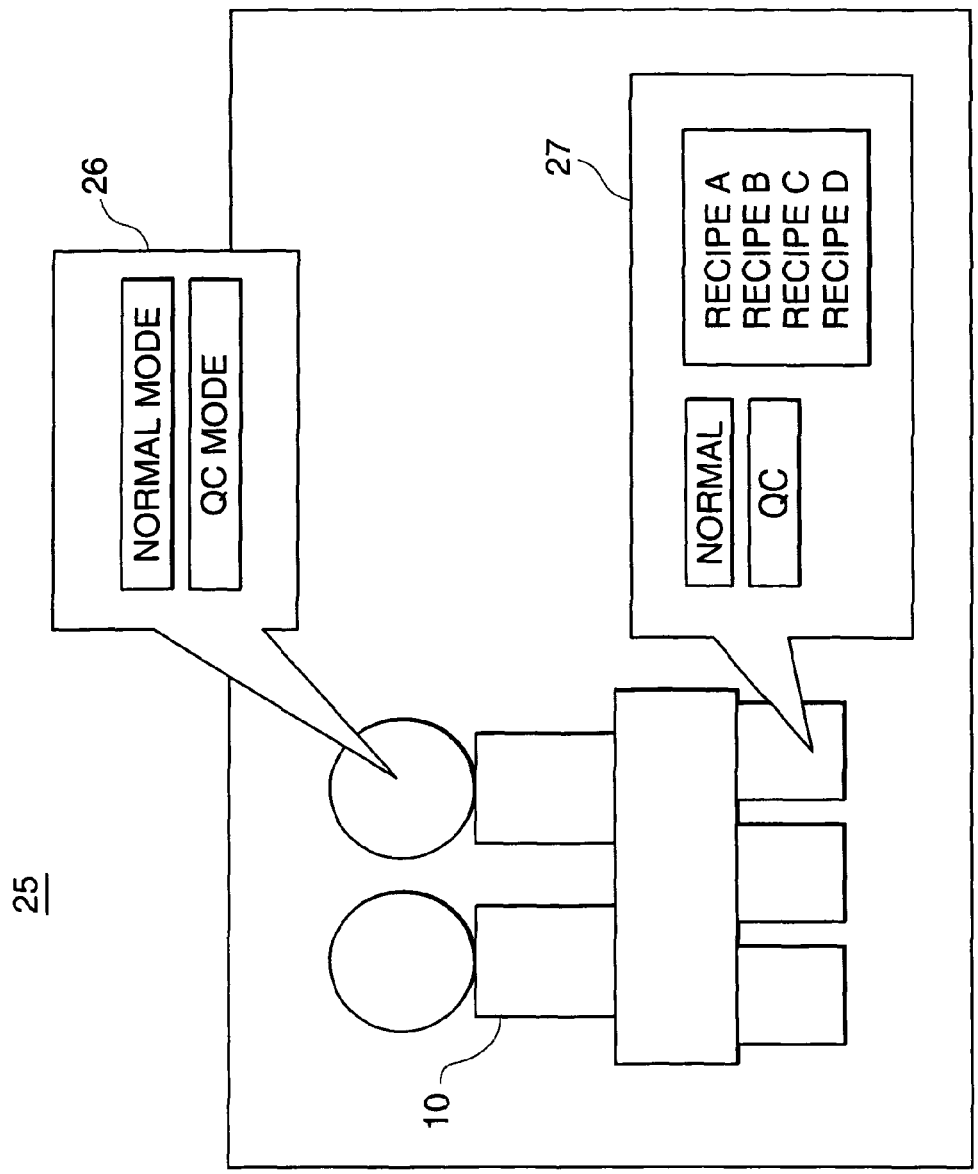
FIG. 2 is a diagram showing a display screen displayed on a display section of an operation controller appearing in FIG. 1.

FIG. 2 is a diagram showing a display screen displayed on the display section 25 of the operation controller 22 appearing in FIG. 1.

Referring to FIG. 2, the display section 25 of the operation controller 22 displays a schematically represented model of the substrate processing apparatus 10. Further, the display section 25 has the function of a touch panel, and when the operator touches any of portions of the displayed model, which are associated with component elements of the substrate processing apparatus 10, respectively, a corresponding one of sub windows, such as popup windows 26 and 27, which are associated with the respective portions, is displayed. The sub window displays not only operating conditions of the component element associated with the touched portion but also a menu of options of operation of the component element. By selecting a desired option of operation from the displayed menu, the operator can operate a component element associated therewith. For example, the popup window 27 associated with one of the load ports 24 displays details (process recipes) of processing of product wafers W stored in the carrier box 23 connected to the load port 24 associated therewith, so that the operator can select a desired process recipe to thereby carry out desired processing on the product wafers W.

In the substrate processing apparatus 10, to perform etching on a product wafer W, the conveyor arm mechanism 19 takes out one of product wafers W from one of the carrier boxes 23 to carry the product wafer W into the orienter 16, and the orienter 16 performs pre-alignment of the position of the product wafer W. Then, the conveyor arm mechanism 19 further conveys the product wafer W from the orienter 16 into one of the load lock chambers 13.

Then, the conveyor arm 12 receives the product wafer W conveyed into the load lock chamber 13 to convey the same into the processing unit 11, and the processing unit 11 performs etching on the product wafer W. After that, the conveyor arm 12 conveys the etched product wafer W into the load lock chamber 13 to pass the same to the conveyor arm mechanism 19. The conveyor arm mechanism 19 receives the etched product wafer W and conveys the same into the carrier box 23.

As described hereinabove, in the substrate processing apparatus, it is necessary to inspect the condition of the processing unit. In recent years, with an increase in the variety of types of the semiconductor devices, types of processing carried out on the product wafers W have been increasing. Accordingly, inspection of the condition of the processing unit is carried out more frequently, so that there is an increasing demand for execution of the inspection of the condition of the processing unit in timing desired by the operator.

To meet the above demand, the method of inspecting a substrate processing apparatus according to the present embodiment realizes an inspecting function, which is referred to hereinafter as "the QC (Quality Control) check function". The QC check function is provided for inhibiting a product wafer W from being conveyed into a processing unit to be inspected, and carrying a wafer for inspection (hereinafter referred to as "the QC wafer") into the processing unit to be inspected. Inspection processing is performed on a QC wafer conveyed into the processing unit to be inspected, and the condition of the processing unit are inspected by inspecting the condition of the QC wafer having been subjected to the inspection processing, e.g. by measuring the amount of particles deposited on the wafer and an etching rate based on the depth of a trench of the wafer.

The QC check function include four functions described hereinafter: "a QC mode-setting function", "a QC carrier-handling function", "a QC job start function", and "a QC mode-canceling function". These functions are realized by the control section controlling the operations of the component elements according to an inspection program loaded in the RAM.

The QC mode-setting function is to inhibit a product wafer W from being conveyed into a processing unit designated by the operator or a host computer (hereinafter simply referred to as "the host") connected to the substrate processing apparatus 10, in response to an instruction given by the operator or the host, for inspecting the processing unit.

The QC carrier-handling function is for the control section to recognize, when a notification that one of the carrier boxes 23 connected to the associated load port 24 stores the QC wafer is received from the operator or the host, that the carrier box 23 connected to the load port 24 associated therewith is a carrier box storing the QC wafer (hereinafter referred to as "the QC carrier"), and permit the QC wafer to be conveyed from the QC carrier connected to the load port 24 into the processing unit to be inspected.

The QC job start function is for the control section to start conveying of the QC wafer from the QC carrier connected to the associated load port 24 into the processing unit to be inspected, in response to an instruction from the operator or the host, for starting the inspection.

The QC mode-canceling function is for the control section to cancel the inhibition of product wafers W from being conveyed into the processing unit to be inspected, in response to an instruction from the operator or the host.

Hereinafter, these functions will be described in detail with reference to flowcharts.

Figure 3:
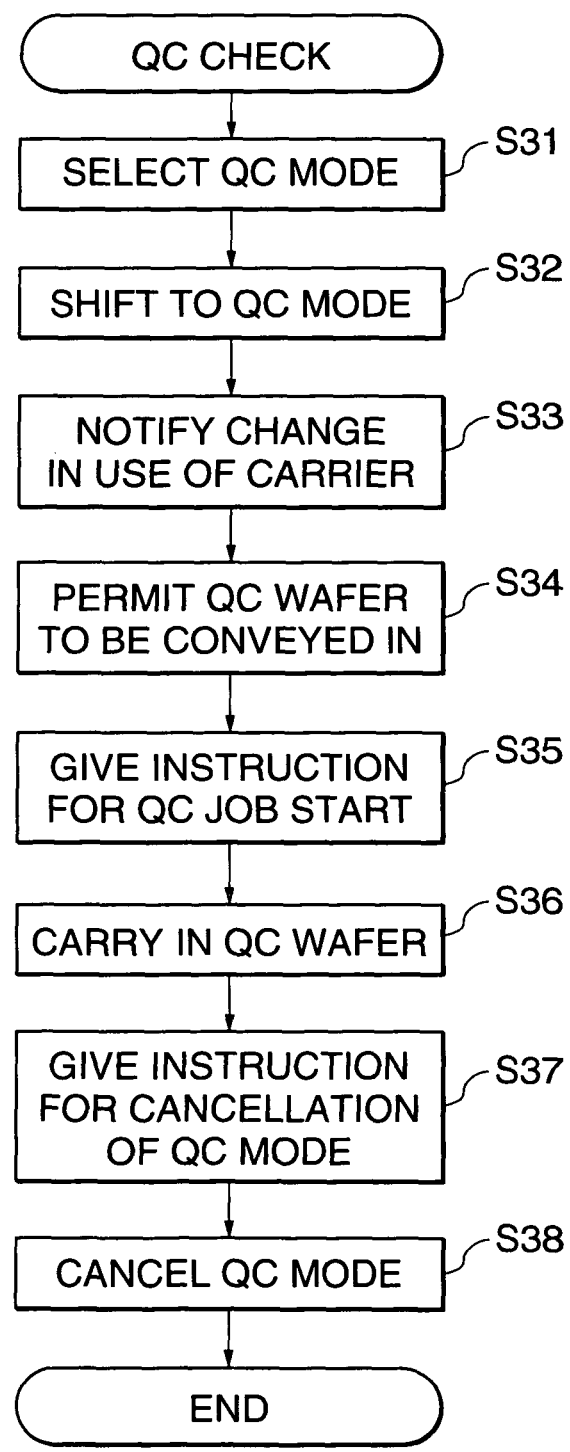
FIG. 3 is a flowchart showing a QC check process performed for realizing a QC check function in the present embodiment.

FIG. 3 is a flowchart showing a QC check process performed to realize the QC check function in the present embodiment.

Referring to FIG. 3, first, the operator selects a menu option "QC MODE" from a menu displayed in the popup window 26 associated with a processing unit requiring inspection, in desired timing, e.g. when abnormal noise is generated from the processing unit, or the host instructs the control section to inspect a processing unit (step S31). Then, the control section shifts the mode of the processing unit to be inspected to the QC mode which inhibits a product wafer W from being conveyed into the processing unit, according to the selection of the QC mode by the operator, or in response to the instruction from the host (step S32) (substrate carrying-in inhibiting step).

In the substrate processing apparatus 10, it is impossible to remove a carrier box 23 from a load port 24 associated therewith until processing of all the product wafers W contained therein is completed. When the QC mode has been selected by the operator, or when the instruction has been given by the host, if the control section immediately shifts the mode of the processing unit to be inspected to the QC mode, there is a fear that the carrier box 23 containing the product wafers W cannot be removed from the load port 24 associated therewith.

To cope with this, in the method of inspecting a substrate processing apparatus according to the present embodiment, during execution of processing of product wafers W by a processing unit, the control section does not shift the mode of the processing unit to be inspected to the QC mode until completion of processing of all the product wafers W contained in the carrier box 23, which contains the product wafer W being processed (hereinafter referred to as "the carrier box in processing"). This makes it possible to process all the product wafers W contained in the carrier box in processing, thereby making it possible to remove the carrier box in processing from the load port 24 associated therewith before execution of the inspection of the condition of the processing unit to be inspected.

Then, the operator selects a menu option "QC" in the popup window 27 associated with the load port 24 connected to the QC carrier (special port declaration), or the host notifies the control section of which load port 24 the QC carrier is connected to, thereby notifying the control section of a change in the use of a wafer stored in the carrier connected to the load port 24, that is, of the fact that the wafer stored in the carrier connected to the load port 24 is the QC wafer (step S33). The control section enables the QC wafer to be conveyed from the QC carrier connected to the associated load port 24 to the processing unit to be inspected, in response to the notification of the change in use of the wafer (step S34) (inspection substrate carrying-in permitting step). This makes it possible to convey the QC wafer into the processing unit to be inspected after the processing unit to be inspected is shifted to the QC mode.

It should be noted that the host may notify the control section not of which load port 24 the QC carrier has been connected to but of which load port 24 the QC carrier is to be connected to. In short, the host may notify the control section of the fact before the QC carrier is connected to the load port 24.

Further, in the step S33, when the menu option "QC" is selected in the popup window 27 associated with the load port 24 connected to the QC carrier, the control section displays a "QC START" button (not shown) in the popup window 27.

Furthermore, the operator selects an inspecting recipe, e.g. a recipe in which the processing unit to be inspected is included in a transfer path, from a list of the process recipes displayed in the popup window 27 associated with the load port 24 connected to the QC carrier, or pushes or touches the displayed "QC START" button, or the host instructs the control section to start the inspection to thereby instruct the control section to start a QC job associated with an inspecting recipe (step S35). In response to the instruction for the start of the QC job, the control section starts to cause the QC wafer to be conveyed from the QC carrier into the processing unit to be inspected, according to the QC job (step S36) (inspection substrate carrying-in start step), and performs inspection processing of the QC wafer conveyed into the processing unit.

The condition of the processing unit is inspected by inspecting the condition of the QC wafer having been subjected to the inspection processing, e.g. by measuring the amount of particles deposited on the wafer and an etching rate based on the depth of a trench of the wafer, and it is determined based on the result of the inspection whether product wafers W should continue to be permitted to be conveyed into the processing unit for etching, or maintenance of the processing unit should be performed.

Then, after the inspection of the condition of the processing unit is completed, the operator selects a menu option "Normal Mode" from a menu displayed in the popup window 26 associated with the processing unit to be inspected, or the host instructs the control section to cancel the QC mode of the processing unit to be inspected (step S37). In response to the selection of the normal mode by the operator, or in response to the instruction from the host for canceling the QC mode, the control section shifts the mode of the processing unit to be inspected from the QC mode to the normal mode which permits product wafers W to be conveyed into the processing unit to be inspected (step S38) (substrate carrying-in inhibition-canceling step), followed by terminating the present process.

According to the method of inspecting a substrate processing apparatus according to the present embodiment, the mode of the processing unit to be inspected is shifted to the QC mode for inhibiting product wafers W from being conveyed into the processing unit, in response to selection of the QC mode by the operator or the instruction for inspection of the processing unit by the host (step S32), and in response to the notification of a change in the use of the wafer, the QC wafer is permitted to be conveyed from the QC carrier connected to the associated load port 24 into the processing unit to be inspected (step S34), and starts to be conveyed from the QC carrier into the processing unit to be inspected, in response to the instruction for the start of the QC job (step S36). This makes it possible to prevent the product wafers W from being conveyed into the processing unit to be inspected, and inspect the condition of the processing unit in desired timing by performing the notification of a change in the use of the wafer in desired timing. Furthermore, in the method of inspecting a substrate processing apparatus according to the present embodiment, there is no need to open a lid of the processing unit, since the inspecting wafer is used. For these reasons, it is possible for the operator to freely inspect the condition of the processing unit.

Further, the mode of the processing unit to be inspected is shifted from the QC mode to the normal mode which permits product wafers W to be conveyed into the processing unit to be inspected, in response to the selection of the normal mode by the operator, or in response to the instruction for canceling the QC mode by the host (step S38). This makes it possible to smoothly resume processing of product wafers W after inspection of the condition of the processing unit.

In the above-described method of inspecting a substrate processing apparatus according to the present embodiment, when the menu option "QC" is selected in the popup window 27 associated with the load port 24 connected to the QC carrier, the QC start button is displayed in the popup window 27, and when the QC start button is pushed or touched, the control section of the substrate processing apparatus 10 is instructed to start the QC job, so that the operator can easily recognize that a processing unit to which he/she is about to supply a QC wafer is one to be inspected, and start inspection of the condition of the processing unit by the same operation as performed at the start of processing of product wafers W. This makes it possible to lessen burden on the operator.

Further, in the above-described method of inspecting a substrate processing apparatus according to the present embodiment, the QC wafer is permitted to be conveyed into the processing unit to be inspected, in response to the notification of a change in the use of the wafer. Although it is determined whether or not the QC wafer is permitted to be conveyed into the processing unit to be inspected, based on the notification of a change in the use of the wafer, this is not limitative, but the determination may be made e.g. from a setting of a transfer path of a wafer contained in the carrier box 23 connected to the associated load port 24. More specifically, when a transfer path including a processing unit to be inspected is set as a transfer path of a wafer contained in a carrier box 23 connected to a load port 24 associated therewith, without notification of a change in the use of the wafer, the control section recognizes that the carrier box 23 connected to the associated load port 24 is a QC carrier, and that the wafer conveyed from the carrier box 23 is a QC wafer, whereby the control section may permit the QC wafer to be conveyed from the carrier box 23 into the processing unit to be inspected. At this time as well, the operator can execute inspection of the condition of the processing unit in desired timing by setting the transfer path in desired timing.

Next, a description will be given of a method of inspecting a substrate processing apparatus according to a second embodiment of the present invention.

The present embodiment has basically the same construction and effects as those of the above-described first embodiment, and is distinguished from the first embodiment only in the QC mode-setting function. Therefore, duplicate description of the construction and effects is omitted, and only different points of the construction and effects of the present embodiment from the first embodiment will be described hereafter.

The QC mode-setting function in the present embodiment is to inhibit product wafers W from being conveyed into a processing unit to be inspected, depending on the result of inspection of a product wafer W which is processed.

Figure 4:
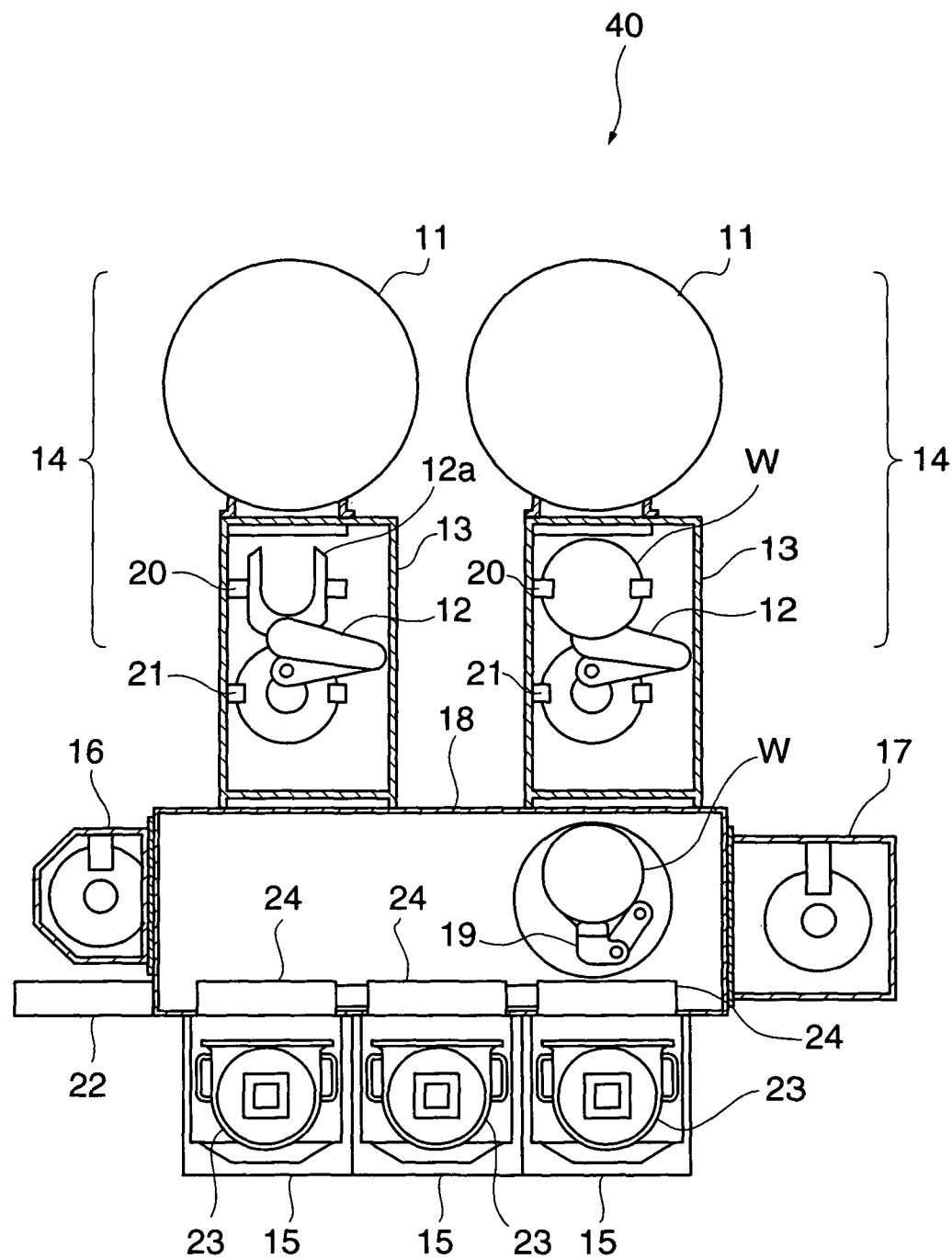
FIG. 4 is a plan view schematically showing the arrangement of a substrate processing apparatus to which is applied a method of inspecting a substrate processing apparatus according to a second embodiment of the present invention.

FIG. 4 is a plan view schematically showing the arrangement of a substrate processing apparatus to which is applied the method of inspecting a substrate processing apparatus according to the present embodiment.

As shown in FIG. 4, the substrate processing apparatus 40 has the same construction as that of the FIG. 1 substrate processing apparatus 10, but is distinguished from the substrate processing apparatus 10 in that it has a wafer-measuring device 17 disposed at the other end of the loader unit 18 in the longitudinal direction thereof. The wafer-measuring device 17 measures the amount of particles deposited on a product wafer W having been etched in a processing unit 11 and an etching rate thereof to thereby inspect the product wafer W.

The host determines whether or not the mode of a processing unit 11 should be shifted to the QC mode, depending on the result of the inspection of the product wafer W by the wafer-measuring device 17.

Figure 5:
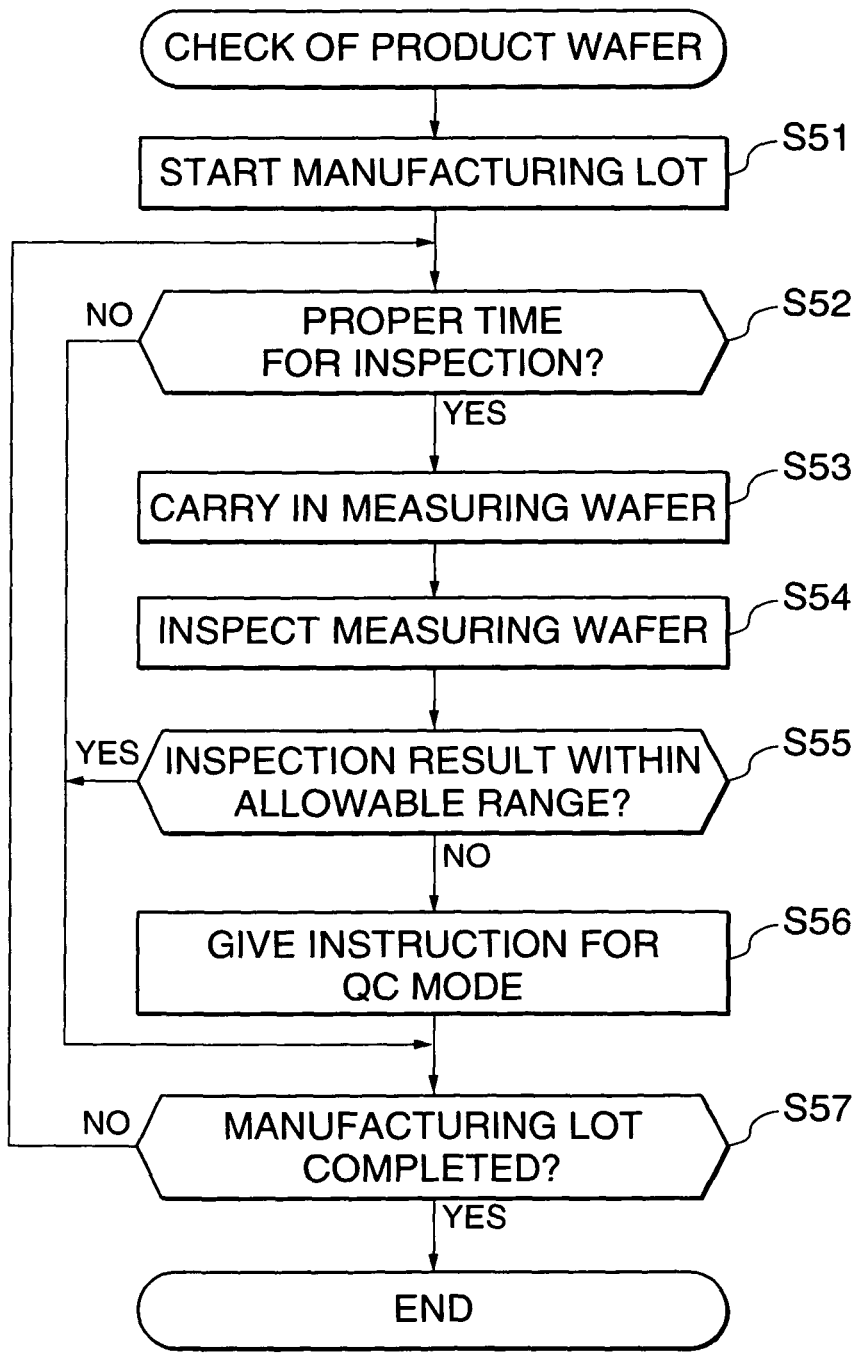
FIG. 5 is a flowchart showing a product wafer-checking process executed for realizing a QC mode function in the present embodiment.

FIG. 5 is a flowchart showing a product wafer-checking process executed for realizing a QC mode function in the present embodiment.

As shown in FIG. 5, first, a carrier box 23 storing product wafers W is connected to a load port 24 associated therewith, and when the control section starts processing of product wafers W in a manufacturing lot in response to an instruction of the operator or the host (step S51), the host determines whether or not it is a proper time for inspecting a product wafer W (step S52). If it is not a proper time for inspecting a product wafer W, the process proceeds to a step S57, whereas if it is a proper time for inspecting the product wafer W, one product wafer W is conveyed from the carrier box 23 into a processing unit 11 as a measuring wafer (step S53), and etching is performed on the measuring wafer conveyed into the processing unit 11.

After etching, the etched measuring wafer is conveyed into the wafer-measuring device 17, where the measuring wafer is inspected by measuring the amount of particles deposited thereon, and an etching rate based on the depth of a trench of the wafer (step S54). The result of the inspection is notified to the host.

The host determines whether or not the notified result of the inspection is within an allowable range set in advance (step S55). If it is within the allowable range, the process proceeds to a step S57, whereas if it is not within the allowable range, the host determines that it is necessary to inspect the condition of the processing unit 11, and instructs the control section to inspect the processing unit 11 (step S56).

In a step S57 following the step 56, the host determines whether or not processing of all the product wafers W in the manufacturing lot has been completed. If the processing of all the product wafers W has not been completed, the process returns to the step S52, whereas if the processing of all the product wafers W has been completed, the present process is terminated.

Further, in the method of inspecting a substrate processing apparatus according to the present embodiment, the steps S32 to S38 in the FIG. 3 processing are performed after termination of the FIG. 5 process.

In the method of inspecting a substrate processing apparatus according to the present embodiment, an etched measuring wafer is inspected; product wafers W are inhibited from being conveyed into the processing unit to be inspected depending on the result of inspection of the measuring wafer; and the QC wafer is permitted to be conveyed from the QC carrier into the processing unit to be inspected, in response to a notification that the QC carrier connected to the associated load port 24 contains the QC wafer. This makes it possible to prevent product wafers W from being supplied into the processing unit to be inspected, and dispense with the need for the operator to set timing for inspecting the processing unit, thereby making it possible to lessen burden on the operator.

Further, since the condition of a measuring wafer is measured by the wafer-measuring device 17 in the product wafer-checking process, it is possible to quickly determine whether or not it is necessary to perform maintenance of the processing unit.

Although in the method of inspecting a substrate processing apparatus according to the present embodiment, the wafer-measuring device 17 measures the amount of particles deposited on a measuring wafer and an etching rate based on the depth of a trench of the wafer, this is not limitative, but items to be measured by the wafer-measuring device 17 may be the thickness of a film formed on a surface of the measuring wafer, for example.

Next, a description will be given of a method of inspecting a substrate processing apparatus according to a third embodiment of the present invention.

The present embodiment also has basically the same construction and effects as those of the above-described first embodiment, and is distinguished from the first embodiment only in the QC mode-setting function. Therefore, duplicate description of the construction and effects is omitted, and only different points of the construction and effects of the present embodiment from the first embodiment will be described hereafter.

The QC mode-setting function in the present embodiment is to inhibit product wafers from being conveyed into a processing unit to be inspected, depending on the result of monitoring of a management item of the substrate processing apparatus.

The method of inspecting a substrate processing apparatus according to the present embodiment may be applied to both of the FIG. 1 substrate processing apparatus 10 and the FIG. 4 substrate processing apparatus 40, described hereinabove. In this embodiment, however, the host monitors the management item of the substrate processing apparatus, such as the number of times of execution of etching, and determines depending on the result of the monitoring whether or not the mode of a processing unit 11 should be shifted to the QC mode.

Figure 6:
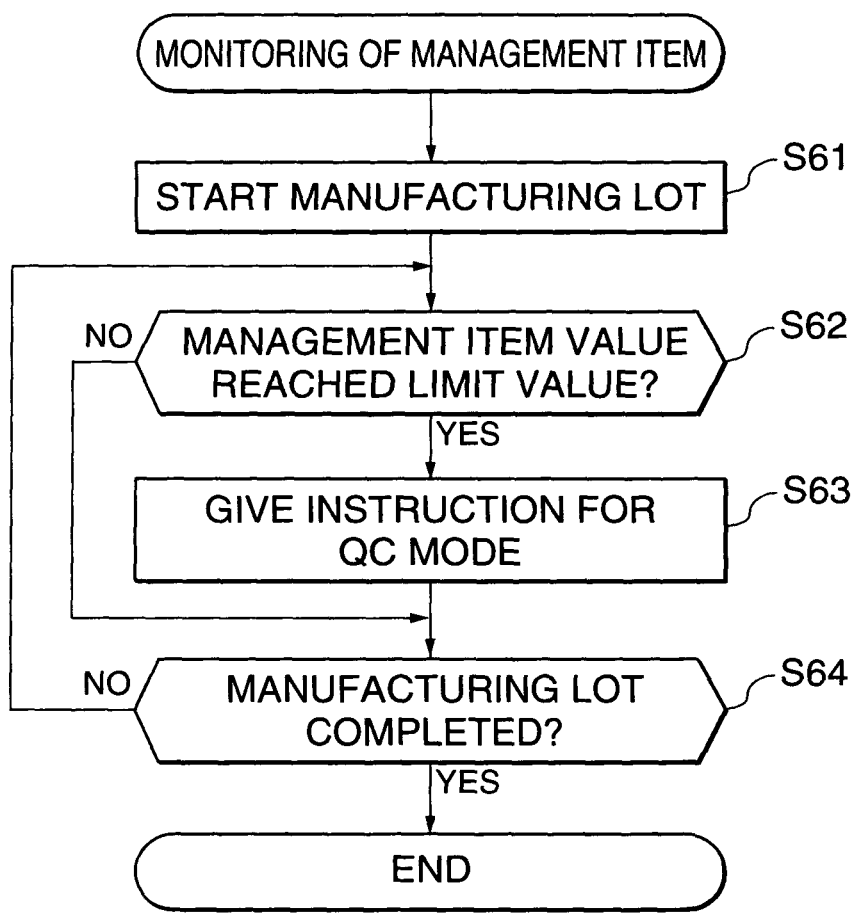
FIG. 6 is a flowchart showing a management item-monitoring process executed for realizing a QC mode function in the third embodiment of the present invention.

FIG. 6 is a flowchart showing a management item-monitoring process executed for realizing the QC mode function in the present embodiment.

As shown in FIG. 6, first, a carrier box 23 storing product wafers W is connected to a load port 24 associated therewith, and when the control section starts processing of product wafers W in a manufacturing lot in response to an instruction of the operator or the host (step S61), the host starts monitoring of the management item of the substrate processing apparatus, such as the number of times of execution of etching, and determines whether or not the value of the management item has reached a limit value, e.g. whether or not the number of times of execution of etching has reached an allowable number of times (step S62). If the value of the management item has not reached the limit value, the process proceeds to a step S64, whereas if the value of the management item has reached the limit value, the host determines that it is necessary to inspect the condition of the processing unit 11, and instruct the control section to inspect the processing unit 11 (step S63).

In a step S64 following the step 63, the host determines whether or not processing of all the product wafers W in the manufacturing lot has been completed. If the processing of all the product wafers W has not been completed, the process returns to the step S62, whereas if the processing of all the product wafers W has been completed, the present process is terminated.

Further, in the method of inspecting a substrate processing apparatus according to the present embodiment as well, the steps S32 to S38 in the FIG. 3 processing are performed after termination of the FIG. 6 process.

In the method of inspecting a substrate processing apparatus according to the present embodiment, the management item of the substrate processing apparatus is monitored; product wafers are inhibited from being conveyed into a processing unit to be inspected, depending on the result of monitoring of the management item of the substrate processing apparatus; and the QC wafer is permitted to be conveyed from a QC carrier into the processing unit to be inspected, in response to a notification that the QC carrier connected to the associated load port 24 contains the QC wafer. This makes it possible to prevent product wafers W from being supplied to the processing unit to be inspected, and dispense with the need for the operator to set timing for inspecting the processing unit, thereby making it possible to lessen burden on the operator.

Although in the method of inspecting a substrate processing apparatus according to the present embodiment, the host monitors the number of times of execution of etching as the management item of the substrate processing apparatus, this is not limitative, but the item to be monitored by the wafer-measuring device 17 may be accumulated time during which electric discharge is performed in a processing unit 11, running time of the processing unit 11, the amount of use of a process gas, or the like.

Although in the method of inspecting a substrate processing apparatus according to the above-described embodiments, the condition of a processing unit is inspected, this is not limitative, but the condition of a transfer system comprised of the load lock chamber 13 and the loader unit 18 may be inspected by transferring a QC wafer only within the load lock chamber 13 and the loader unit 18 for measuring the amount of particles deposited on the QC wafer.

Further, although in the method of inspecting a substrate processing apparatus according to the above-described embodiments, when a shift to the QC mode is instructed, the control section inhibits the mode of a processing unit to be inspected from shifting to the QC mode until processing of all the product wafers W contained in a carrier box in processing is completed, this is not limitative, but the control section may immediately shift the mode of the processing unit to the QC mode. In doing this, the control section may forcibly terminate the processing of the product wafer W in the processing unit.

Although in the methods of inspecting a substrate processing apparatus according to the second and third embodiments, the host determines whether or not the mode of a processing unit 11 should be shifted to the QC mode, depending on the result of inspection of a product wafer (measuring wafer), or the result of monitoring of the management item of the substrate processing apparatus, that is not limitative, but the control section of the substrate processing apparatus may determine whether or not the mode of the processing unit 11 should be shifted to the QC mode, depending on the result of the inspection or the monitoring, described above.

Although the substrate processing apparatus to which are applied the method of inspecting a substrate processing apparatus according to the above-described embodiments is an etching apparatus, this is not limitative, but the substrate processing apparatus may be a coating/developing apparatus, a substrate cleaning apparatus, a heat treatment apparatus, a wet etching apparatus, or a film forming apparatus.

Figure 7A:
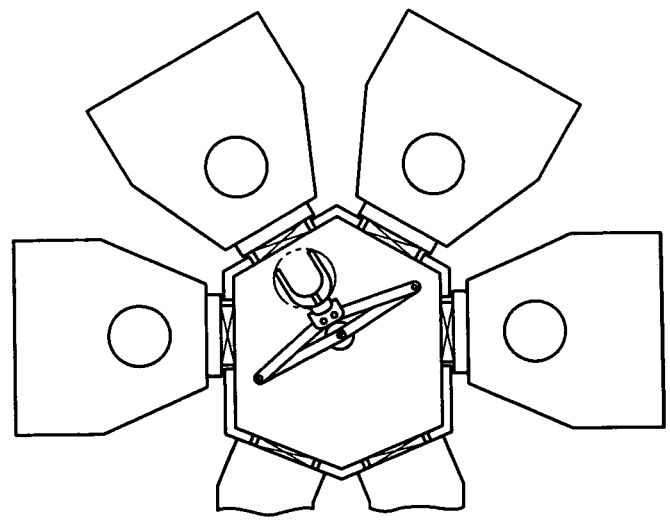
Figure 7B:
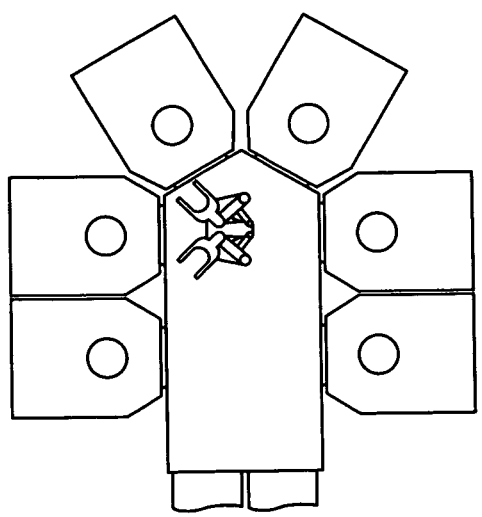

Further, although the substrate processing apparatus to which are applied the method of inspecting a substrate processing apparatus according to the above-described embodiments is a parallel-type substrate processing apparatus having two process ships 14, as appearing in FIGS. 1 and 4, arranged in parallel with each other, this is not limitative, but as shown in FIGS. 7A and 7B, the substrate processing apparatus may be a cluster-type substrate processing apparatus (FIG. 7A) having a plurality of processing units radially arranged around a conveying chamber provided with a frog leg-type transfer arm for conveying a product wafer W, or a substrate processing apparatus (FIG. 7B) having a conveying chamber provided with a double arm-type transfer arm comprised of two SCARA-type conveyor arms, and a plurality of processing units arranged in a manner surrounding the conveying chamber. It is to be understood that similarly to the substrate processing apparatuses shown in FIGS. 1 and 4, the substrate processing apparatuses shown in FIGS. 7A and 7B each also include carrier-mounting stages 15, an orienter 16, a loader unit 18, and an operation controller 22.

Furthermore, although in the above-described embodiments, a substrate to be processed is a semiconductor wafer, this is not limitative, but a glass substrate e.g. for an LCD or an FPD (Flat Panel Display) may be processed, for example.

Further, it is to be understood that the object of the present invention may also be accomplished by supplying the system or the apparatus, with a storage medium in which a program code of software, which realizes the functions of the above described embodiments, is stored, and causing a computer (or CPU or MPU) of the system or the apparatus to read out and execute the program code stored in the storage medium.

The above program has only to realize the functions of the above described embodiment on a computer, and the form of the program may be an object code, a program code executed by an interpreter, or script data supplied to an OS.

In this case, the program code itself read from the storage medium realizes the novel functions of any of the above described embodiments, and therefore the program code and the storage medium in which the program code is stored constitute the present invention.

Examples of the storage medium for supplying the program code include a floppy (registered trademark) disk, a hard disk, a magnetic-optical disk, an optical disk such as a CD-ROM, a CD-R, a CD-RW, a DVD-ROM, a DVD-RAM, a DVD-RW, and a DVD+RW, a magnetic tape, a nonvolatile memory card, and a ROM. Alternatively, the program may be downloaded via a network from another computer, a database, or the like, not shown, connected to the Internet, a commercial network, a local area network, or the like.

Further, it is to be understood that the functions of any of the above described embodiments may be accomplished not only by executing the program code read out by a computer, but also by causing an OS (operating system) or the like which operates on the computer to perform a part or all of the actual operations based on instructions of the program code.

Further, it is to be understood that the functions of any of the above described embodiments may be accomplished by writing a program code read out from the storage medium into a memory provided on an expansion board inserted into a computer or a memory provided in an expansion unit connected to the computer and then causing a CPU or the like provided in the expansion board or the expansion unit to perform a part or all of the actual operations based on instructions of the program code.

What is claimed is:

1. A method of controlling substrate carrying-in performed in a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, comprising:

a substrate carrying-in inhibiting step of inhibiting, in response to an external instruction, which is issued when abnormal noise is generated from the substrate processing chamber, subsequent product substrates from being conveyed into the substrate processing chamber from which the abnormal noise is generated after the external instruction;

an inspection substrate carrying-in permitting step of permitting an inspection substrate to be conveyed from a predetermined one of the containers which is connected to the inlet port into the substrate processing chamber from which the abnormal noise is generated, in response to a notification that the predetermined container contains the inspection substrate; and a container removing step of removing the container from the inlet port after processing all the product substrates contained in the container, the container being a removable element distinct from the substrate processing apparatus, wherein said substrate carrying-in inhibiting step further comprises continuing processing all the product substrates contained in the container, which is connected to the inlet port and which previously contained a product substrate being processed, before the external instruction is received, and continuing processing all the product substrates contained in the container without interrupting processing the product substrates by the substrate processing chamber from which the abnormal noise is generated and then inhibiting conveying the subsequent product substrates into the substrate processing chamber from which the abnormal noise is generated only after completion of the processing of all the product substrates contained in the container even after the external instruction is received, wherein the continued processing of all the product substrates contained in the container is performed using the substrate processing chamber, in which the abnormal noise is generated, even after the external instruction for inhibiting is received.

2. The method of controlling substrate carrying-in as claimed in claim 1, comprising an inspection substrate carrying-in start step of starting conveying the inspection substrate into the substrate processing chamber from which the abnormal noise is generated in response to an instruction for starting inspection processing.

3. The method of controlling substrate carrying-in as claimed in claim 1, comprising a substrate carrying-in inhibition-canceling step of canceling inhibition of carrying-in of the product substrates into the substrate processing chamber from which the abnormal noise is generated after inspection of condition of the substrate processing chamber from which the abnormal noise is generated.

4. The method of controlling substrate carrying-in as claimed in claim 1, wherein the substrate processing apparatus is provided with a display section for displaying a button for instructing starting of the processing, and wherein the display section displays a button for instructing starting of inspection of the substrate processing chamber from which the abnormal noise is generated in response to the notification that the predetermined container connected to the inlet port contains the inspection substrate.

5. A method of controlling substrate carrying-in performed in a substrate processing apparatus including at least one substrate processing chamber for processing product substrates, and a substrate conveying chamber that is connected to the substrate processing chamber, for conveying the product substrates therethrough, the substrate conveying chamber having at least one inlet port to which are connected containers containing the product substrates and through which the product substrates are supplied from the containers to the substrate processing chamber, comprising:

a substrate carrying-in inhibiting step of inhibiting, in response to an external instruction, which is issued when abnormal noise is generated from the substrate processing chamber, subsequent product substrates from being conveyed into the substrate processing chamber from which the abnormal noise is generated after the external instruction;

an inspection substrate carrying-in permitting step of permitting an inspection substrate to be conveyed from a predetermined one of the containers connected to the inlet port into the substrate processing chamber from which the abnormal noise is generated when a transfer path including the substrate processing chamber from which the abnormal noise is generated is set as a transfer path for transferring the inspection substrate contained in the predetermined container; and a container removing step of removing the container from the inlet port after processing all the product substrates contained in the container, the container being a removable element distinct from the substrate processing apparatus, wherein said substrate carrying-in inhibiting step further comprises continuing processing all the product substrates contained in the container, which is connected to the inlet port and which previously contained a product substrate being processed, before the external instruction is received, and continuing processing the product substrates without interrupting processing all the product substrates contained in the container by the substrate processing chamber from which the abnormal noise is generated and then inhibiting conveying the subsequent product substrates into the substrate processing chamber from which the abnormal noise is generated only after completion of the processing of all the product substrates contained in the container even after the external instruction is received, wherein the continued processing of all the product substrates contained in the container is performed using the substrate processing chamber, in which the abnormal noise is generated, even after the external instruction for inhibiting is received.

6. The method of controlling substrate carrying-in as claimed in claim 1, wherein the external instruction is an instruction for shifting an operating mode of the substrate processing apparatus to QC mode which inhibits the product substrate from being conveyed into the substrate processing chamber from which the abnormal noise is generated.

* * * * *